(12) United States Patent
Cao

(10) Patent No.: US 12,302,741 B2
(45) Date of Patent: May 13, 2025

(54) METHOD OF MANUFACTURING DISPLAY PANEL, DISPLAY PANEL, AND MOBILE TERMINAL

(71) Applicant: Shenzhen China Star Optoelectronics Semiconductor Display Technology Co., Ltd., Guangdong (CN)

(72) Inventor: Erchuang Cao, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 415 days.

(21) Appl. No.: 17/764,187

(22) PCT Filed: Mar. 2, 2022

(86) PCT No.: PCT/CN2022/078716
§ 371 (c)(1),
(2) Date: Mar. 27, 2022

(87) PCT Pub. No.: WO2023/151143
PCT Pub. Date: Aug. 17, 2023

(65) Prior Publication Data
US 2023/0263044 A1    Aug. 17, 2023

(51) Int. Cl.
*H01L 29/08* (2006.01)
*H10K 50/84* (2023.01)
(Continued)

(52) U.S. Cl.
CPC .......... *H10K 77/111* (2023.02); *H10K 50/84* (2023.02); *H10K 71/00* (2023.02)

(58) Field of Classification Search
CPC ...... H10K 77/111; H10K 50/84; H10K 71/00; H10K 59/873; H10K 50/844;
(Continued)

(56) References Cited

U.S. PATENT DOCUMENTS

2021/0055606 A1    2/2021   Nie

FOREIGN PATENT DOCUMENTS

CN    107946341 A    4/2018
CN    110444697 A    11/2019
(Continued)

OTHER PUBLICATIONS

Chinese Office Action issued in corresponding Chinese Patent Application No. 202210151035.X dated Nov. 9, 2024, pp. 1-7.

*Primary Examiner* — Niki H Nguyen
(74) *Attorney, Agent, or Firm* — Rivka Friedman

(57) ABSTRACT

Embodiments of the present application disclose a method of manufacturing a display panel, a display panel, and a mobile terminal. A first flexible substrate, an inorganic layer, a second flexible substrate, a drive circuit layer, and a light emitting element layer are sequentially formed on a rigid substrate. The rigid substrate is provided with a protrusion, the first flexible substrate is provided with an opening corresponding to the protrusion, the inorganic layer is provided with a first recess corresponding to the protrusion, and the protrusion is inserted into the first recess. Finally, the rigid substrate is peeled off to produce the display panel.

15 Claims, 7 Drawing Sheets

(51) Int. Cl.
*H10K 71/00* (2023.01)
*H10K 77/10* (2023.01)

(58) Field of Classification Search
CPC ............. H10K 59/122; H10K 59/1213; H10K 2102/311; H10K 59/12; H10K 59/40; H10K 59/65; H10K 59/60; H10K 59/10; H10K 59/50; H10K 59/00; H10K 59/125; H10K 50/10; H10K 2102/3031; H10K 2102/302; H10K 59/80516; H10K 10/464; H10K 10/466; H10K 77/10
See application file for complete search history.

(56) References Cited

FOREIGN PATENT DOCUMENTS

| | | |
|---|---|---|
| CN | 111403457 A | 7/2020 |
| CN | 111508993 A | 8/2020 |
| CN | 111584582 A | 8/2020 |
| CN | 113328046 A | 8/2021 |
| WO | WO-2022188168 A1 * | 9/2022 |

\* cited by examiner

METHOD OF MANUFACTURING DISPLAY PANEL, DISPLAY PANEL, AND MOBILE TERMINAL

TECHNICAL FIELD

The present application relates to the field of display, and in particular to a method for manufacturing a display panel, a display panel, and a mobile terminal.

BACKGROUND

As organic light-emitting display (OLED) technology is widely developed and applied in depth, a display screen with a high screen ratio and better visual experience has become one of current trends of display technology development. Although a screen frame is reduced and a screen ratio is increased to some extent in shaped screens such as a hole-dig screen, a water-drop screen, and a notch screen, screen integrity is damaged and visual experience of consumers is affected.

In order to achieve full screen display, a space occupied by a camera in the screen is particularly important. Camera under panel (CUP) technology greatly increases the screen ratio of display screens. The camera under panel technology enables the full screen display without damaging the screen integrity. In addition, a camera under panel area may display images, mainly by self-emitting of the OLED screen, and through gaps between pixels of the OLED screen using transparent characteristics to achieve imaging. In a front camera area, the display panel is a small transparent screen, which can normally display screen contents when not taking a photograph and become a transparent film when taking a photograph.

However, there are still a lot of unsatisfactory problems when current OLED screens are applied to the camera under panel. For example, a flexible polyimide substrate used in the OLED screen is yellow, which absorbs a certain transmitted blue light. That is, transmittance of the OLED screen is low, which affects the imaging of the camera under panel.

Technical Problems

Embodiments of the present application provide a method of manufacturing a display panel, a display panel, and a mobile terminal, which may solve a technical problem of low transmittance of an OLED screen.

Technical Solutions

An embodiment of the present application provides a method of manufacturing a display panel, comprising following steps:

Forming a first flexible substrate on a rigid substrate, wherein the rigid substrate is provided with a protrusion, and the first flexible substrate is provided with an opening corresponding to the protrusion;

Forming an inorganic layer on the first flexible substrate, wherein the inorganic layer is provided with a first recess corresponding to the protrusion, and the protrusion is inserted into the first recess;

Forming a second flexible substrate on the inorganic layer;

Forming a drive circuit layer and a light emitting element layer on the second flexible substrate; and Peeling off the rigid substrate.

Optionally, in some embodiments of the present application, in the step of forming the inorganic layer on the first flexible substrate, one end of the first recess is in communication with the opening, and another end of the first recess is closed.

Optionally, in some embodiments of the present application, in the step of forming the inorganic layer on the first flexible substrate, the first recess is configured to penetrate the inorganic layer.

Optionally, in some embodiments of the present application, in the step of forming the second flexible substrate on the inorganic layer, the second flexible substrate is provided with a second recess corresponding to the protrusion, and the protrusion is inserted into the second recess through the first recess.

Optionally, in some embodiments of the present application, in the step of forming the second flexible substrate on the inorganic layer, one end of the second recess is in communication with the first recess, and another end of the second recess is closed.

Optionally, in some embodiments of the present application, in the step of forming the second flexible substrate on the inorganic layer, the second recess is configured to penetrate the second flexible substrate.

Optionally, in some embodiments of the present application, the method further comprises forming a buffer layer on the second flexible substrate, before the step of forming the drive circuit layer and the light emitting element layer on the second flexible substrate;

In the step of forming the drive circuit layer and the light emitting element layer on the second flexible substrate, the drive circuit layer and the light emitting element layer are formed on the buffer layer.

Optionally, in some embodiments of the present application, in the step of forming the buffer layer on the second flexible substrate, the buffer layer is provided with a third recess corresponding to the protrusion, and the protrusion is inserted into the third recess through the second recess.

Optionally, in some embodiments of the present application, before the step of peeling off the rigid substrate, the method further comprises:

Forming an encapsulation layer on the light emitting element layer, wherein the encapsulation layer is provided with a fourth recess corresponding to the protrusion.

An embodiment of the present application further provides a display panel, comprising:

A first flexible substrate provided with an opening;

An inorganic layer covering the first flexible substrate, wherein the inorganic layer is provided with a first recess corresponding to the opening, and the first recess is in communication with the opening;

A second flexible substrate covering the inorganic layer;

A drive circuit layer disposed on the second flexible substrate; and

A light emitting element layer disposed on the drive circuit layer.

Optionally, in some embodiments of the present application, one end of the first recess is in communication with the opening, and another end of the first recess is closed.

Optionally, in some embodiments of the present application, the first recess is configured to penetrate the inorganic layer.

Optionally, in some embodiments of the present application, the second flexible substrate is provided with a second recess corresponding to the first recess, and the second recess is in communication with the first recess.

Optionally, in some embodiments of the present application, one end of the second recess is in communication with the first recess, and another end of the second recess is closed.

Optionally, in some embodiments of the present application, the second recess is configured to penetrate the second flexible substrate.

Optionally, in some embodiments of the present application, the display panel further comprises a buffer layer disposed between the second flexible substrate and the drive circuit layer.

Optionally, in some embodiments of the present application, the buffer layer is provided with a third recess corresponding to the second recess, and the third recess is in communication with the second recess.

Optionally, in some embodiments of the present application, the display panel further comprises an encapsulation layer covering the light emitting element layer.

Optionally, in some embodiments of the present application, the encapsulation layer is provided with a fourth recess corresponding to the first recess.

An embodiment of the present application further provides a mobile terminal comprising a terminal body and the display panel as described above, wherein the terminal body is integrated with the display panel.

Beneficial Effects

According to the embodiments of the present application, provided are a method of manufacturing a display panel, a display panel and a mobile terminal. A first flexible substrate, an inorganic layer, a second flexible substrate, a drive circuit layer and a light emitting element layer are sequentially formed on a rigid substrate provided with a protrusion, thereby an opening disposed on the first flexible substrate and a first recess disposed on the inorganic layer may be formed without adding a step of patterning. The opening and the first recess correspond to the camera under panel, thus improving the transmittance of the display panel and facilitating the camera under panel imaging.

DESCRIPTION OF THE DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

EMBODIMENTS OF THE PRESENT INVENTION

Figure 1:
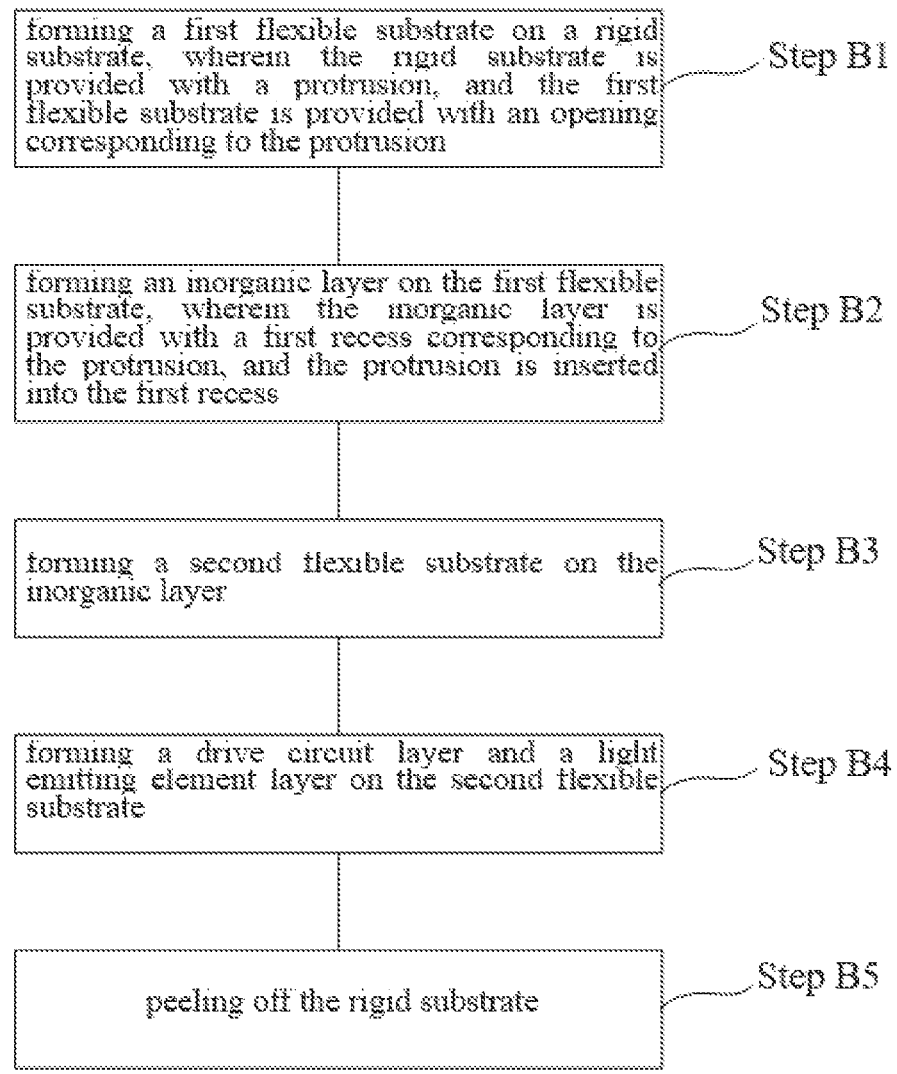
FIG. 1 is a schematic flowchart of a method of manufacturing a display panel according to an embodiment of the present application.

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure. In addition, it should be understood that the specific implementations described here are only used to illustrate and explain the present disclosure, and are not used to limit the present disclosure. In the present disclosure, unless otherwise stated, directional words used such as "upper" and "lower" generally refer to the upper and lower directions of the device in actual use or working state, and specifically refer to the drawing directions in the drawings; and "inner" and "outer" refer to the outline of the device.

Embodiments of the present application provide a method of manufacturing a display panel, a display panel, and a mobile terminal. Detailed description will be given below, respectively. It should be noted that the order of description of the following embodiments is not a limitation on the preferred order of the embodiments.

Figure 2:
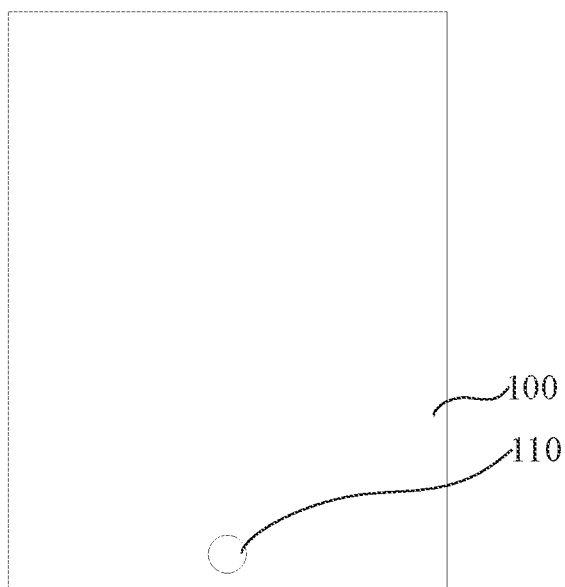
FIG. 2 is a top view structural schematic diagram of a rigid substrate according to an embodiment of the present application.
Figure 3:
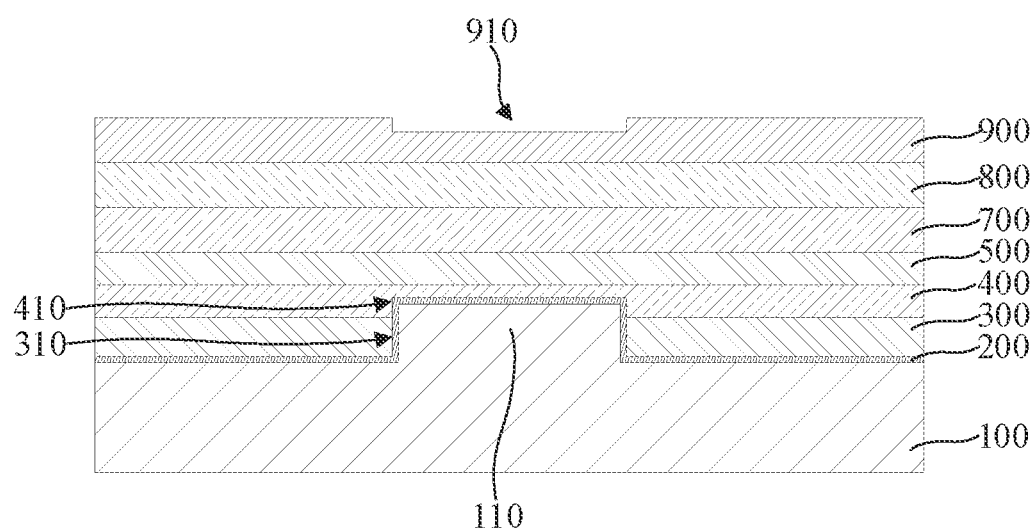
FIG. 3 is a first schematic structural view of manufacturing a display panel according to an embodiment of the present application.
Figure 4:
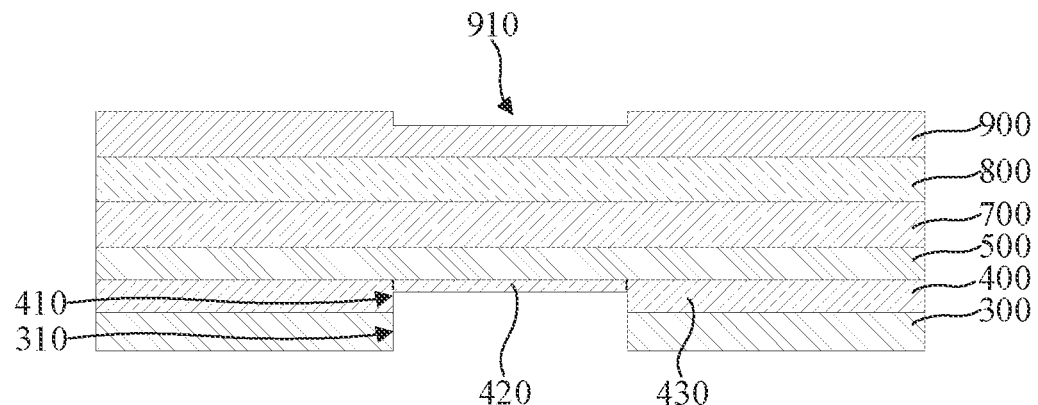
FIG. 4 is a sectional structural schematic view of a first display panel according to an embodiment of the present application.

Referring to FIG. 1, in conjunction with FIGS. 2 to 4, an embodiment of the present application provides a method of manufacturing a display panel, comprising following steps:

Step B1: a first flexible substrate 300 is formed on the rigid substrate 100. The rigid substrate 100 is provided with a protrusion 110, and the first flexible substrate 300 is provided with an opening 310 corresponding to the protrusion 110;

Step B2: an inorganic layer 400 is formed on the first flexible substrate 300. The inorganic layer 400 is provided with a first recess 410 corresponding to the protrusion 110, and the protrusion 110 is inserted into the first recess 410;

Step B3: a second flexible substrate 500 is formed on the inorganic layer 400;

Step B4: a drive circuit layer 700 and a light emitting element layer 800 are formed on the second flexible substrate 500;

Step B5: the rigid substrate 100 is peeled off.

It should be noted that, as shown in FIGS. 2 to 4, a position of the protrusion 110 corresponds to a position of a camera under panel, and positions of the opening 310 and the first recess 410 formed subsequently correspond to the position of the camera under panel. It is so provided that when the camera under panel is disposed under the display panel, ambient light passes through the display panel to reach the camera under panel without passing through the first flexible substrate 300, which may improve transmittance of the display panel and reduce light loss, thereby facilitating imaging of the camera under panel. Further, the inorganic layer 400 is disposed between the first flexible substrate 300 and the second flexible substrate 500, so that the inorganic layer 400 is stably attached to the first flexible substrate 300, and the second flexible substrate 500 is stably attached to the inorganic layer 400, thereby increasing adhesion force of the second flexible substrate 500 and preventing the second flexible substrate 500 from being peeled off.

In the method of manufacturing the display panel according to an embodiment of the present application, the opening 310 disposed on the first flexible substrate 300 and the first recess 410 disposed on the inorganic layer 400 may be formed corresponding to the camera under panel without additional steps of patterning, by sequentially forming the first flexible substrate 300, the inorganic layer 400, the second flexible substrate 500, the drive circuit layer 700, and the light emitting element layer 800 on the rigid substrate 100 provided with the protrusion 110, thereby improving the transmittance of the display panel and facilitating the imaging of the camera under panel.

Specifically, a material of the rigid substrate 100 may be glass. Certainly, the material of the rigid substrate 100 may be appropriately changed according to selection of an actual situation and the specific requirements.

Specifically, as shown in FIG. 3, in the above-described Step B1, the first flexible substrate 300 is formed on the rigid substrate 100 by coating, wherein a coating thickness is less than a thickness of the protrusion 110, thereby forming the first flexible substrate 300 having the opening 310. In this embodiment, the opening 310 may be formed on the first flexible substrate 300 without further adding the step of the patterning process, so that a manufacturing process is simple and production cost can be reduced.

Specifically, a material of the first flexible substrate 300 may be polyimide. Certainly, the material of the first flexible substrate 300 may be appropriately changed according to the selection of the actual situation and the specific requirements.

Specifically, as shown in FIGS. 3 and 4, in the step B2 of forming the inorganic layer 400 on the first flexible substrate 300, one end of the first recess 410 communicates with the opening 310, and another end of the first recess 410 is closed. That is, the first recess 410 is a groove that does not penetrate the inorganic layer 400. With this arrangement, in a display panel thus prepared, a portion of the inorganic layer 400 corresponding to the first recess 410 is relatively thin. During a process in which ambient light passes through the display panel to reach the camera under panel, the light loss may be reduced due to the relatively thin portion of the inorganic layer 400 corresponding to the first recess 410, thereby further improving the transmittance of the display panel and facilitating the camera under panel imaging. In this embodiment, the thicknesses of the first flexible substrate 300 and inorganic layer 400 are greater than a thickness of the protrusion 110.

Specifically, as shown in FIGS. 3 and 4, the inorganic layer 400 includes a first bottom wall 420 and a first side wall 430. The first side wall 430 is disposed on a peripheral side of the first bottom wall 420, and the first bottom wall 420 and the first side wall 430 form together a first recess 410.

Specifically, as shown in FIGS. 3 and 4, during a bending process of the display panel, since the portion of the inorganic layer 400 corresponding to the first recess 410 is relatively thin, the portion of the inorganic layer 400 corresponding to the first recess 410 is easily fractured. In this case, during a process in which the ambient light passes through the display panel and reaches the camera under panel, a fractured portion of the inorganic layer 400 may refract a part of the light. As a result, the part of the light cannot normally reach the camera under panel, which increases the light loss and is unfavorable to the camera under panel imaging. In order to avoid the above-described problems, it should be ensured that the portion of the inorganic layer 400 corresponding to the first recess 410 has a sufficient thickness so that a depth of the first recess 410 is less than or equal to two-thirds of a thickness of the first side wall 430. For example, the depth of the first recess 410 is two-thirds, one-half, one-third, or one-fourth of the thickness of the first side wall 430, which is not uniquely limited here.

Figure 5:
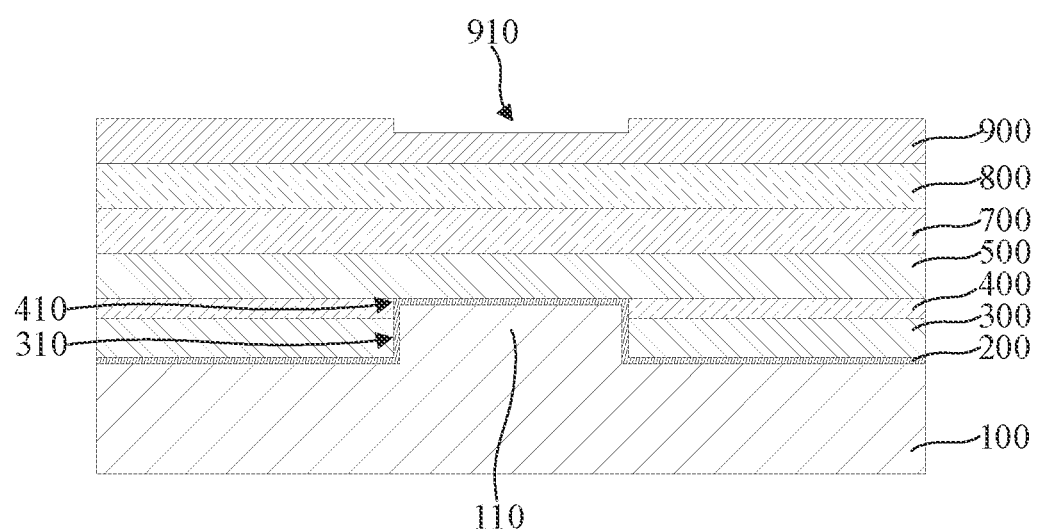
FIG. 5 is a second schematic structural view of manufacturing a display panel according to an embodiment of the present application.
Figure 6:
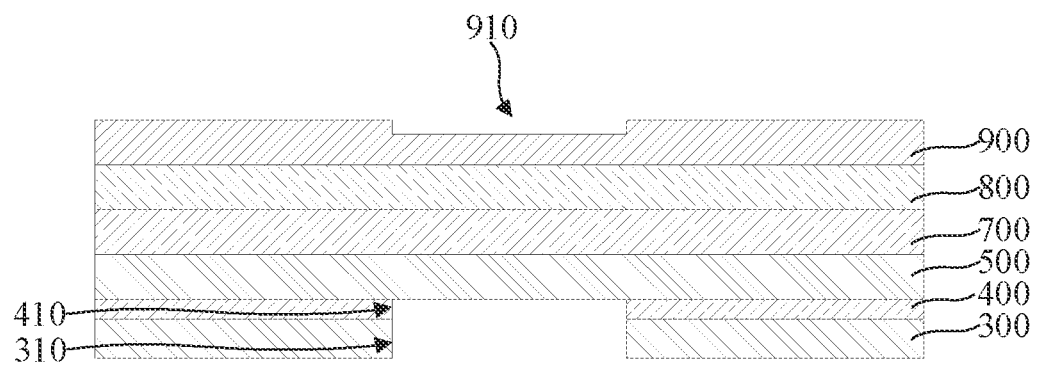
FIG. 6 is a sectional structural schematic view of a second display panel according to an embodiment of the present application.

Specifically, as shown in FIGS. 5 and 6, in the step B2 described above of forming the inorganic layer 400 on the first flexible substrate 300, the first recess 410 is configured to penetrate the inorganic layer 400. That is, the first recess 410 has a hollow structure penetrating the inorganic layer 400. With this arrangement, in the display panel thus prepared, the ambient light is not required to pass through the inorganic layer 400 and may reach the camera under panel during the process of passing through the display panel to reach the camera under panel, and the light loss can be reduced, thereby further improving the transmittance of the display panel, and facilitating the camera under panel imaging. In this embodiment, the thicknesses of the first flexible substrate 300 and inorganic layer 400 are equal to or less than the thickness of the protrusion 110.

Specifically, in the above-described step B2, the inorganic layer 400 is formed on the first flexible substrate 300 by a chemical vapor deposition method or a physical vapor deposition method. In the embodiment shown in FIGS. 3 and 4, the inorganic layer 400 covers the protrusion 110, and in the embodiment shown in FIGS. 5 and 6, the inorganic layer 400 does not cover the protrusion 110 to form the inorganic layer 400 having the first recess 410. In this embodiment, the first recess 410 may be formed on the inorganic layer 400 without adding a step of a patterning process, so that the manufacturing process is simple, and the production cost may be reduced.

Specifically, in the embodiments of the present application, a material of the inorganic layer 400 may be selected from one or more of amorphous silicon, silicon oxide, silicon nitride, and silicon oxynitride. Certainly, the material of the inorganic layer 400 may be appropriately changed according to the selection of the actual situation and the specific requirements, and is not uniquely limited here.

Figure 7:
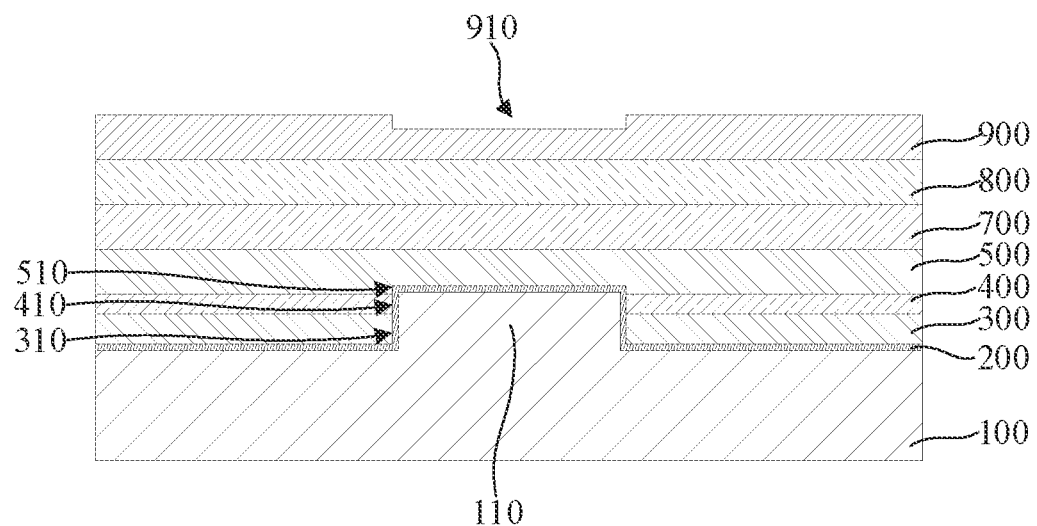
FIG. 7 is a third schematic structural view of manufacturing a display panel according to an embodiment of the present application.
Figure 8:
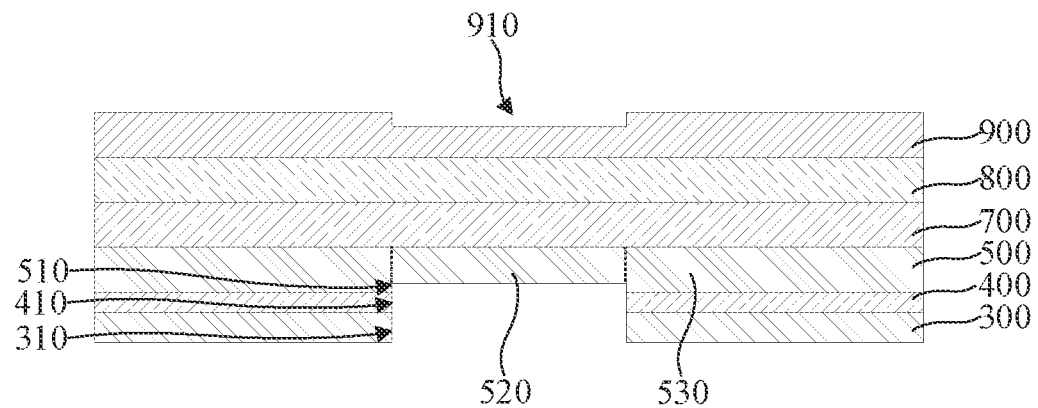
FIG. 8 is a sectional structural schematic view of a third display panel according to an embodiment of the present application.

Specifically, as shown in FIGS. 7 and 8, in the step B3 of forming the second flexible substrate 500 on the inorganic layer 400, the second flexible substrate 500 is provided with a second recess 510 corresponding to the protrusion 110, and the protrusion 110 is inserted into the second recess 510 through the first recess 410. With this arrangement, in the display panel thus prepared, a portion of the second flexible substrate 500 corresponding to the second recess 510 is relatively thin. During a process in which ambient light passes through the display panel and reaches the camera under panel, since the portion of the second flexible substrate 500 corresponding to the second recess 510 is relatively thin, the light loss can be reduced, thereby further improving the transmittance of the display panel and facilitating the camera under panel imaging. In this embodiment, the thicknesses of the first flexible substrate 300, the inorganic layer 400, and the second flexible substrate 500 are greater than the thickness of the protrusion 110.

Specifically, as shown in FIGS. 7 and 8, in the step B3 of forming the second flexible substrate 500 on the inorganic layer 400, one end of the second recess 510 communicates with the first recess 410, and another end of the second recess 510 is closed. That is, the first recess 410 is a groove that does not penetrate the second flexible substrate 500. With this arrangement, in the display panel thus prepared, a portion of the second flexible substrate 500 corresponding to the second recess 510 is relatively thin. In a process in which ambient light passes through the display panel and reaches the camera under panel, since the portion of the second flexible substrate 500 corresponding to the second recess 510 is relatively thin, the light loss may be reduced, thereby further improving the transmittance of the display panel and facilitating the camera under panel imaging. In this embodiment, the thicknesses of the first flexible substrate 300, the inorganic layer 400, and the second flexible substrate 500 are greater than the thickness of the protrusion 110.

Specifically, as shown in FIGS. 7 and 8, the second flexible substrate 500 includes a second bottom wall 520 and a second side wall 530. The second side wall 530 is disposed on a peripheral side of the second bottom wall 520, and the second bottom wall 520 and the second side wall 530 form together a second recess 510.

Specifically, as shown in FIGS. 7 and 8, in the bending process of the display panel, since the portion of the second flexible substrate 500 corresponding to the second recess 510 is relatively thin, the portion of the second flexible substrate 500 corresponding to the second recess 510 is easily fractured. In this case, in the process in which ambient light passes through the display panel and reaches the camera under panel, a fractured portion of the second flexible substrate 500 may refract a part of the light. As a result, the part of the light cannot normally reach the camera under panel, thereby increasing light loss, which is unfavorable to the camera under panel imaging. In order to avoid the above problems, it should be ensured that the portion of the second flexible substrate 500 corresponding to the second recess 510 has a sufficient thickness so that a depth of the second recess 510 may be less than or equal to two-thirds of a thickness of the second side wall 530. For example, the depth of the second recess 510 is two-thirds, one-half, one-third, or one-fourth of the thickness of the second side wall 530, which is not uniquely limited here.

Figure 9:
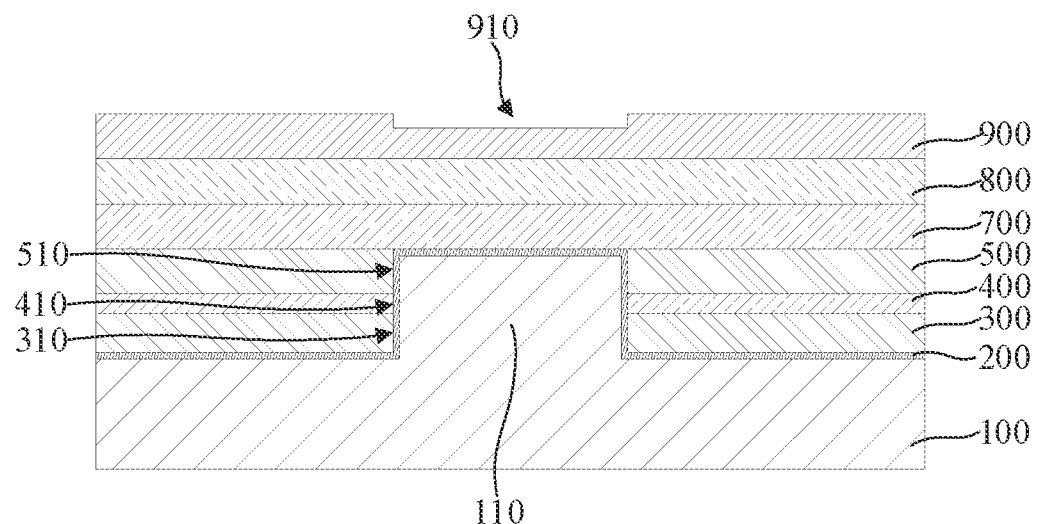
FIG. 9 is a fourth schematic structural view of manufacturing a display panel according to an embodiment of the present application.
Figure 10:
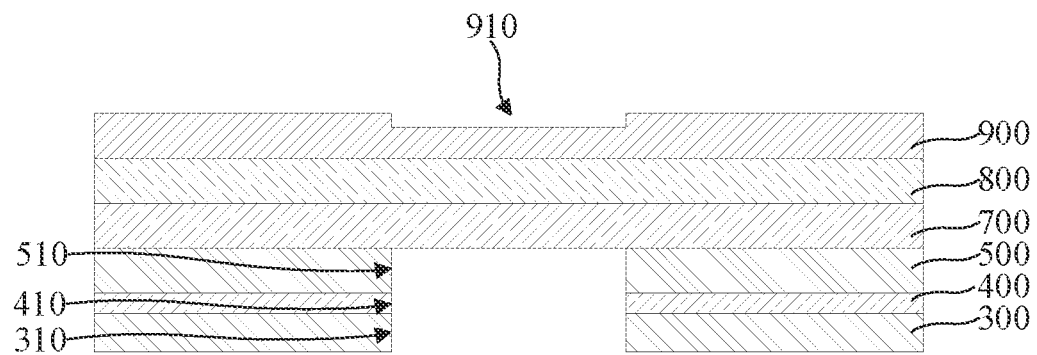
FIG. 10 is a sectional structural schematic view of a fourth display panel according to an embodiment of the present application.

Specifically, as shown in FIGS. 9 and 10, in the above-described step B3 of forming the second flexible substrate 500 on the inorganic layer 400, the second recess 510 is configured to penetrate the second flexible substrate 500. That is, the second recess 510 has a hollow structure penetrating the second flexible substrate 500. With this arrangement, in the display panel thus prepared, the ambient light is not required to pass through the second flexible substrate 500 and may reach the camera under panel during the process of passing through the display panel to reach the camera under panel, thereby reducing light loss, further improving the transmittance of the display panel and facilitating the camera under panel imaging. In this embodiment, the thicknesses of the first flexible substrate 300, the inorganic layer 400, and the second flexible substrate 500 are equal to or less than the thickness of the protrusion 110.

Specifically, in the above-described step B3, the second flexible substrate 500 is formed on the inorganic layer 400 by coating. In the embodiment of FIGS. 7 and 8, the second flexible substrate 500 covers the protrusion 110, and in the embodiment of FIGS. 9 and 10, the second flexible substrate 500 does not cover the protrusion 110 to form the second flexible substrate 500 having the second recess 510. In this embodiment, the second recess 510 may be formed on the second flexible substrate 500 without adding the step of the patterning process, which results in a simple manufacturing process, and reduced production cost.

Specifically, a material of the second flexible substrate 500 may be polyimide. Certainly, the material of the second flexible substrate 500 may be appropriately changed according to the selection of actual situation and the specific requirements.

Figure 11:
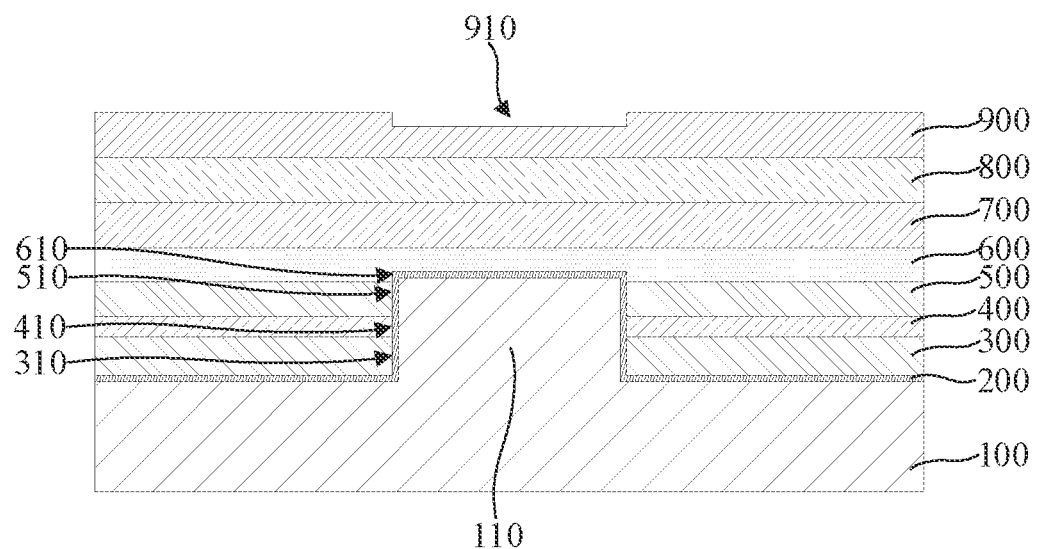
FIG. 11 is a fifth schematic structural view of manufacturing a display panel according to an embodiment of the present application.
Figure 12:
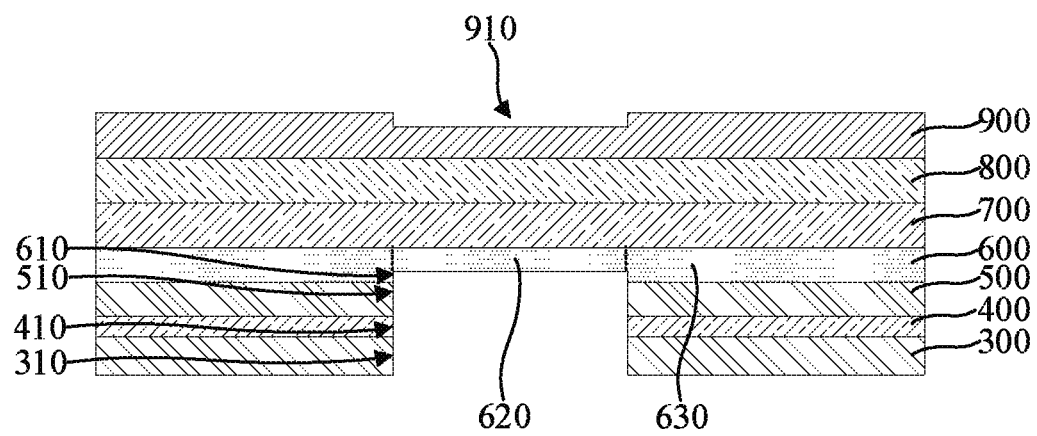
FIG. 12 is a sectional structural schematic view of a fifth display panel according to an embodiment of the present application.

Specifically, as shown in FIGS. 11 and 12, before the step of forming the drive circuit layer 700 and the light emitting element layer 800 on the second flexible substrate 500, the method of manufacturing the display panel further comprises: forming a buffer layer 600 on the second flexible substrate 500. In the step of forming the drive circuit layer 700 and the light emitting element layer 800 on the second flexible substrate 500, the drive circuit layer 700 and the light emitting element layer 800 are formed on the buffer layer 600. In this configuration, by forming the buffer layer 600 between the second flexible substrate 500 and the drive circuit layer 700, the buffer layer 600 is stably attached to the second flexible substrate 500, and the drive circuit layer 700 may be stably attached to the buffer layer 600, thereby increasing adhesion force of the drive circuit layer 700, preventing the drive circuit layer 700 from being peeled off, and effectively improving reliability of the drive circuit layer 700.

Specifically, as shown in FIGS. 11 and 12, in the step of forming the buffer layer 600 on the second flexible substrate 500, the buffer layer 600 is provided with a third recess 610 corresponding to the protrusion 110, and the protrusion 110 is inserted into the third recess 610 through the second recess 510. With this arrangement, in the display panel thus prepared, a portion of the buffer layer 600 corresponding to the third recess 610 is relatively thin. In the process in which ambient light passes through the display panel and reaches the camera under panel, since the portion of the buffer layer 600 corresponding to the third recess 610 is relatively thin, the light loss may be reduced, thereby further improving the transmittance of the display panel and facilitating the camera under panel imaging. In this embodiment, the third recess 610 communicates with the second recess 510. Specifically, the thicknesses of the first flexible substrate 300, the inorganic layer 400, the second flexible substrate 500, and the buffer layer 600 are greater than the thickness of the protrusion 110. One end of the third recess 610 communicates with the second recess 510, and another end of the third recess 610 is closed, i.e., the third recess 610 is a groove that does not penetrate the buffer layer 600

Specifically, as shown in FIGS. 11 and 12, the buffer layer 600 includes a third bottom wall 620 and a third side wall 630. The third side wall 630 is disposed on a peripheral side of the third bottom wall 620, and the third bottom wall 620 and the third side wall 630 form together the third recess 610.

Specifically, as shown in FIGS. 11 and 12, in the bending process of the display panel, since the portion of the buffer layer 600 corresponding to the third recess 610 is relatively thin, the portion of the buffer layer 600 corresponding to the third recess 610 is easily fractured. In this case, when ambient light passes through the display panel and reaches the camera under panel, a fractured portion of the buffer layer 600 may refract a part of the light. As a result, the part of the light cannot normally reach the camera under panel, thereby increasing the light loss, which is unfavorable to the camera under panel imaging. In order to avoid the above problems, it should be ensured that the portion of the buffer layer 600 corresponding to the third recess 610 has a sufficient thickness so that a depth of the third recess 610 is less than or equal to two-thirds of a thickness of the third side wall 630. For example, the depth of the third recess 610 is two-thirds, one-half, one-third, or one-fourth of the thickness of the third side wall 630, which is not uniquely limited here.

Specifically, as shown in FIGS. 11 and 12, the buffer layer 600 is formed on the second flexible substrate 500 by a chemical vapor deposition method or a physical vapor deposition method. The buffer layer 600 covers the protrusion 110 to form the buffer layer 600 having the third recess 610. In this embodiment, the third recess 610 may be formed on the buffer layer 600 without adding the step of the patterning process, thus the manufacturing process is simple, and the production cost may be reduced.

Specifically, in the embodiments of the present application, a material of the buffer layer 600 may be selected from one or more of amorphous silicon, silicon oxide, silicon nitride, and silicon oxynitride. Certainly, the material of the buffer layer 600 may be appropriately changed according to the selection of actual situation and the specific requirements.

Specifically, in the embodiments of the present application, before the above-described step B5 of peeling off the rigid substrate 100, the method of manufacturing the display panel further comprises: forming an encapsulation layer 900 on the light emitting element layer 800. The encapsulation layer 900 is applied to encapsulate the light emitting element layer 800 and the drive circuit layer 700, preventing moisture or oxygen from penetrating into the light emitting element layer 800 and the drive circuit layer 700, so that the display panel may have a prolonged service life.

Specifically, in the step of forming the encapsulation layer 900 on the light emitting element layer 800, the encapsulation layer 900 is provided with a fourth recess 910 corresponding to the protrusion 110. With this arrangement, in the display panel thus prepared, a portion of the encapsulation layer 900 corresponding to the fourth recess 910 is relatively thin. In the process in which ambient light passes through the display panel and reaches the camera under panel, since the portion of the encapsulation layer 900 corresponding to the fourth recess 910 is relatively thin, the light loss may be reduced, thereby further improving the transmittance of the display panel and facilitating the camera under panel imaging. In this embodiment, the fourth recess 910 is a groove that does not penetrate the encapsulation layer 900.

Specifically, in the embodiments of the present application, if the first flexible substrate 300 is directly peeled off from the rigid substrate 100 in the above-described step B5, the first flexible substrate 300 is easily damaged. In order to avoid the above problems, in the above step B1, a sacrificial layer 200 is disposed on a surface of the rigid substrate 100. The sacrificial layer 200 covers the protrusion 110. The first flexible substrate 300 is formed on the sacrificial layer 200, and the inorganic layer 400, the second flexible substrate 500, and the buffer layer 600, which are subsequently formed, may be disposed on the protrusion 110 by the sacrificial layer 200. In the above step B5, the sacrificial layer 200 is irradiated with laser light to separate the rigid substrate 100 from the first flexible substrate 300, thereby peeling off the rigid substrate 100.

Specifically, a material of the sacrificial layer 200 may be amorphous silicon. Certainly, the material of the sacrificial layer 200 may be appropriately changed according to the selection of actual situation and the specific requirements.

As shown in FIGS. 4, 6, 8, 10, and 12, an embodiment of the present application further provides a display panel prepared by the above manufacturing method. The display panel comprises a first flexible substrate 300, an inorganic layer 400, a second flexible substrate 500, a drive circuit layer 700 and a light emitting element layer 800. The first flexible substrate 300 is provided with an opening 310. The inorganic layer 400 covers the first flexible substrate 300 and is provided with a first recess 410 corresponding to the opening 310, wherein the first recess 410 communicates with the opening 310. The second flexible substrate 500 covers the inorganic layer 400. The drive circuit layer 700 is disposed on the second flexible substrate 500. The light emitting element layer 800 is disposed on the drive circuit layer 700.

In the display panel of the embodiment of the present application, when the camera under panel is disposed under the display panel, the ambient light passes through the display panel and reaches the camera under panel, and is not required to pass through the first flexible substrate 300, thereby improving the transmittance of the display panel, reducing the light loss, and facilitating the camera under panel imaging. Further, the inorganic layer 400 is disposed between the first flexible substrate 300 and the second flexible substrate 500, so that the inorganic layer 400 is stably attached to the first flexible substrate 300, and the second flexible substrate 500 is stably attached to the inorganic layer 400, thereby increasing the adhesion force of the second flexible substrate 500 and preventing the second flexible substrate 500 from being peeled off.

Specifically, as shown in FIGS. 3 and 4, one end of the first recess 410 communicates with the opening 310, and another end of the first recess 410 is closed. That is, the first recess 410 is a groove that does not penetrate the inorganic layer 400. With this arrangement, the portion of the inorganic layer 400 corresponding to the first recess 410 is relatively thin. When ambient light passes through the display panel and reaches the camera under panel, since the portion of the inorganic layer 400 corresponding to the first recess 410 is relatively thin, the light loss may be reduced, the transmittance of the display panel may be further improved, thereby facilitating the camera under panel imaging.

Specifically, as shown in FIGS. 3 and 4, the inorganic layer 400 comprises a first bottom wall 420 and a first side wall 430. The first side wall 430 is disposed on a peripheral side of the first bottom wall 420, and the first bottom wall 420 and the first side wall 430 form together a first recess 410.

Specifically, as shown in FIGS. 3 and 4, in the bending process of the display panel, the portion of the inorganic layer 400 corresponding to the first recess 410 is relatively thin, so that the portion of the inorganic layer 400 corresponding to the first recess 410 is easily fractured. In this case, when ambient light passes through the display panel and reaches the camera under panel, the fractured portion of the inorganic layer 400 may refract a part of the light, so that the part of the light cannot normally reach the camera under panel, thereby increasing the light loss, which is unfavorable to the camera under panel imaging. In order to avoid the above-described problems, it should be ensured that the portion of the inorganic layer 400 corresponding to the first recess 410 has a sufficient thickness so that the depth of the first recess 410 may be less than or equal to two-thirds of the thickness of the first side wall 430. For example, the depth of the first recess 410 is two-thirds, one-half, one-third, or one-fourth of the thickness of the first side wall 430, which is not uniquely limited here.

Specifically, as shown in FIGS. 5 and 6, the first recess 410 is configured to penetrate the inorganic layer 400. That is, the first recess 410 has a hollow structure penetrating the inorganic layer 400. With this arrangement, the ambient light is not required to pass through the inorganic layer 400 and may reach the camera under panel during the process of passing through the display panel to reach the camera under panel, so that light loss may be reduced, the transmittance of the display panel may be further improved, thereby facilitating the camera under panel imaging.

Specifically, as shown in FIGS. 7 and 8, the second flexible substrate 500 is provided with a second recess 510 corresponding to the first recess 410. The second recess 510 communicates with the first recess 410. With this arrangement, a portion of the second flexible substrate 500 corresponding to the second recess 510 is relatively thin. When ambient light passes through the display panel and reaches the camera under panel, since the portion of the second flexible substrate 500 corresponding to the second recess 510 is relatively thin, the light loss may be reduced, and the transmittance of the display panel may be further improved, thereby facilitating the camera under panel imaging.

Specifically, as shown in FIGS. 7 and 8, one end of the second recess 510 communicates with the first recess 410, and another end of the second recess 510 is closed. That is, the first recess 410 is a groove that does not penetrate the second flexible substrate 500. With this arrangement, a portion of the second flexible substrate 500 corresponding to the second recess 510 is relatively thin. When ambient light passes through the display panel and reaches the camera under panel, since the portion of the second flexible substrate 500 corresponding to the second recess 510 is relatively thin, the light loss may be reduced, and the transmittance of the display panel may be further improved, thereby facilitating the camera under panel imaging.

Specifically, as shown in FIGS. 7 and 8, the second flexible substrate 500 comprises a second bottom wall 520 and a second side wall 530. The second side wall 530 is disposed on a peripheral side of the second bottom wall 520, and the second bottom wall 520 and the second side wall 530 form together a second recess 510.

Specifically, as shown in FIGS. 7 and 8, in the bending process of the display panel, since the portion of the second flexible substrate 500 corresponding to the second recess 510 is relatively thin, the portion of the second flexible substrate 500 corresponding to the second recess 510 is easily fractured. In this case, in a process in which ambient light passes through the display panel and reaches the camera under panel, the fractured portion of the second flexible substrate 500 may refract a part of the light, so that the part of the light cannot normally reach the camera under panel, thereby increasing light loss, which is unfavorable to the camera under panel imaging. In order to avoid the above problems, it should be ensured that the portion of the second flexible substrate 500 corresponding to the second recess 510 has a sufficient thickness. The depth of the second recess 510 may be less than or equal to two-thirds of the thickness of the second side wall 530. For example, the depth of the second recess 510 is two-thirds, one-half, one-third, or one-fourth of the thickness of the second side wall 530, which is not uniquely limited here.

Specifically, as shown in FIGS. 9 and 10, the second recess 510 is configured to penetrate the second flexible substrate 500. That is, the second recess 510 has a hollow structure penetrating the second flexible substrate 500. With this arrangement, the ambient light is not required to pass through the second flexible substrate 500 and may reach the camera under panel during the process of passing through the display panel to reach the camera under panel, so that light loss may be reduced, and the transmittance of the display panel may be further improved, thereby facilitating the camera under panel imaging.

Specifically, as shown in FIGS. 11 and 12, the display panel further comprises a buffer layer 600 disposed between the second flexible substrate 500 and the drive circuit layer 700. In this configuration, by forming the buffer layer 600 between the second flexible substrate 500 and the drive circuit layer 700, the buffer layer 600 is stably attached to the second flexible substrate 500, and the drive circuit layer 700 may be stably attached to the buffer layer 600, thereby increasing the adhesion force of the drive circuit layer 700, preventing the drive circuit layer 700 from being peeled off, and effectively improving the reliability of the drive circuit layer 700.

Specifically, as shown in FIGS. 11 and 12, the buffer layer 600 is provided with a third recess 610 corresponding to the second recess 510. With this arrangement, a portion of the buffer layer 600 corresponding to the third recess 610 is relatively thin. When ambient light passes through the display panel and reaches the camera under panel, since the portion of the buffer layer 600 corresponding to the third recess 610 is relatively thin, the light loss may be reduced, and the transmittance of the display panel is further improved, thereby facilitating the camera under panel imaging. In this embodiment, the third recess 610 communicates with the second recess 510. Specifically, one end of the third recess 610 communicates with the second recess 510, and another end of the third recess 610 is closed. That is, the third recess 610 is a groove that does not penetrate the buffer layer 600.

Specifically, as shown in FIGS. 11 and 12, the buffer layer 600 comprises a third bottom wall 620 and a third side wall 630. The third side wall 630 is disposed on a peripheral side of the third bottom wall 620, and the third bottom wall 620 and the third side wall 630 form together a third recess 610.

Specifically, as shown in FIGS. 11 and 12, in the bending process of the display panel, the portion of the buffer layer 600 corresponding to the third recess 610 is relatively thin, so that the portion of the buffer layer 600 corresponding to the third recess 610 is easily fractured. In this case, when ambient light passes through the display panel and reaches the camera under panel, the fractured portion of the buffer layer 600 may refract a part of the light, so that the part of the light cannot normally reach the camera under panel, thereby increasing the light loss, which is unfavorable to the camera under panel imaging. In order to avoid the above problems, it should be ensured that the portion of the buffer layer 600 corresponding to the third recess 610 has a sufficient thickness. The depth of the third recess 610 may be less than or equal to two-thirds of the thickness of the third side wall 630. For example, the depth of the third recess 610 is two-thirds, one-half, one-third, or one-fourth of the thickness of the third side wall 630, which is not uniquely limited here.

Specifically, in the embodiments of the present application, the display panel further comprises an encapsulation layer 900 covering the light emitting element layer 800. The encapsulation layer 900 is applied to encapsulate the light emitting element layer 800 and the drive circuit layer 700, preventing moisture or oxygen from penetrating into the light emitting element layer 800 and the drive circuit layer 700, and improving the service life of the display panel.

Specifically, the encapsulation layer 900 is provided with a fourth recess 910 corresponding to the first recess 410. With this arrangement, in the display panel thus prepared, a portion of the encapsulation layer 900 corresponding to the fourth recess 910 is relatively thin. In a process in which ambient light passes through the display panel and reaches the camera under panel, since the portion of the encapsulation layer 900 corresponding to the fourth recess 910 is relatively thin, the light loss may be reduced, thereby further improving the transmittance of the display panel and facilitating the camera under panel imaging. In this embodiment, the fourth recess 910 is a groove that does not penetrate the encapsulation layer 900.

Figure 13:
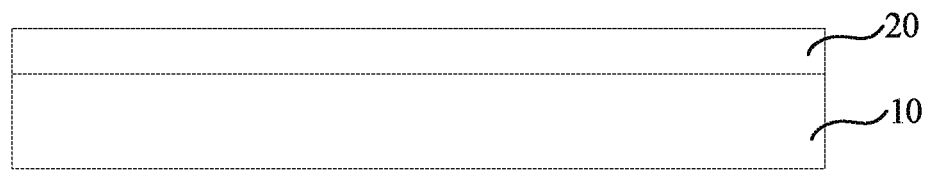
FIG. 13 is a schematic view of a mobile terminal according to an embodiment of the present disclosure.

Referring to FIG. 13, an embodiment of the present application further provides a mobile terminal. The mobile terminal comprises a terminal body 20 and a display panel 10. The display panel 10 employs the display panel of the above embodiments. The terminal body 20 is combined with the display panel 10. In this embodiment, the terminal body 20 may include a middle frame, a sealant for frames, and the like, which are not specifically limited here.

In the embodiments of the present application where the mobile terminal employs the display panel of the above embodiments, when the camera under panel is disposed under the display panel, the ambient light passes through the display panel and reaches the camera under panel without passing through the first flexible substrate 300. Therefore, the transmittance of the display panel may be improved, and the light loss may be reduced, thereby facilitating the camera under panel imaging. Further, by forming the inorganic layer 400 between the first flexible substrate 300 and the second flexible substrate 500, the inorganic layer 400 is stably attached to the first flexible substrate 300, and the second flexible substrate 500 may be stably attached to the inorganic layer 400, thereby increasing the adhesion force of the second flexible substrate 500 and preventing the second flexible substrate 500 from being peeled off.

The method for manufacturing a display panel, a display panel and a mobile terminal provided in the embodiments of the present disclosure are described in detail above. Specific examples are applied herein to illustrate the principle and implementation of the present disclosure. The description of the above embodiments is only used to help understand the technical solutions and core ideas of the present disclosure. There will be changes in the specific implementation and application scope according to the ideas of the present disclosure for those skilled in the art. In summary, the contents of this specification should not be understood as a limitation on the present disclosure.

What is claimed is:

1. A method of manufacturing a display panel, comprising following steps:
   providing a rigid substrate having a protrusion, and forming a laser-decomposable sacrificial layer to cover the rigid substrate and the protrusion;
   forming a first flexible substrate on the rigid substrate, wherein the first flexible substrate is provided with an opening corresponding to the protrusion;
   forming an inorganic layer on the first flexible substrate, wherein the inorganic layer is provided with a first recess corresponding to the protrusion, and the protrusion is inserted into the first recess;
   forming a second flexible substrate on the inorganic layer;
   forming a drive circuit layer and a light emitting element layer on the second flexible substrate; and
   peeling off the rigid substrate from the sacrificial layer, wherein a thickness of the protrusion is great than a total thickness of the first flexible substrate, the inorganic layer, and the second flexible substrate.

2. The method of manufacturing the display panel according to claim 1, wherein in the step of forming the inorganic layer on the first flexible substrate, the first recess is configured to penetrate the inorganic layer.

3. The method of manufacturing the display panel according to claim 2, wherein in the step of forming the second flexible substrate on the inorganic layer, the second flexible substrate is provided with a second recess corresponding to the protrusion, and the protrusion is inserted into the second recess through the first recess.

4. The method of manufacturing the display panel according to claim 3, wherein in the step of forming the second flexible substrate on the inorganic layer, the second recess is configured to penetrate the second flexible substrate.

5. The method of manufacturing the display panel according to claim 4, wherein the method of manufacturing the display panel further comprises forming a buffer layer on the second flexible substrate before the step of forming the drive circuit layer and the light emitting element layer on the second flexible substrate;
   wherein in the step of forming the drive circuit layer and the light emitting element layer on the second flexible substrate, the drive circuit layer and the light emitting element layer are formed on the buffer layer.

6. The method of manufacturing the display panel according to claim 5, wherein in the step of forming the buffer layer on the second flexible substrate, the buffer layer is provided with a third recess corresponding to the protrusion, and the protrusion is inserted into the third recess through the second recess.

7. The method of manufacturing the display panel according to claim 1, wherein before the step of peeling off the rigid substrate, the method of manufacturing the display panel further comprises:
   forming an encapsulation layer on the light emitting element layer, wherein the encapsulation layer is provided with a fourth recess corresponding to the protrusion.

8. A display panel, comprising:
   a first flexible substrate having an opening;
   an inorganic layer covering the first flexible substrate, wherein the inorganic layer is provided with a first recess corresponding to the opening, and the first recess is in communication with the opening;
   a second flexible substrate covering the inorganic layer and having a second recess corresponding to the first recess;
   a buffer layer disposed on the second flexible substrate and having a third recess corresponding to the second recess, wherein the buffer layer comprises a bottom wall and a side wall that form together the third recess, and a depth of the third recess is less than or equal to two-thirds of a thickness of the side wall, a drive circuit layer disposed on the second flexible substrate; and a light emitting element layer disposed on the drive circuit layer.

9. The display panel according to claim 8, wherein the first recess is configured to penetrate the inorganic layer.

10. The display panel according to claim 9, wherein the second recess is in communication with the first recess.

11. The display panel according to claim 10, wherein the second recess is configured to penetrate the second flexible substrate.

12. The display panel according to claim 8, wherein the third recess is in communication with the second recess.

13. The display panel according to claim 8, wherein the display panel further comprises an encapsulation layer covering the light emitting element layer.

14. The display panel according to claim 13, wherein the encapsulation layer is provided with a fourth recess corresponding to the first recess.

15. A mobile terminal comprising a terminal body and the display panel according to claim 8, wherein the terminal body is integrated with the display panel.

* * * * *